(12) United States Patent
Crosland et al.

(10) Patent No.: US 7,064,578 B1
(45) Date of Patent: Jun. 20, 2006

(54) DISTRIBUTED BUS STRUCTURE

(75) Inventors: Andrew Crosland, Aylesbury (GB); Roger May, Bicester (GB); Stephane Caneau, London (GB); Andrew Draper, Chesham (GB); Edward Flaherty, Kingston Bagpuize (GB)

(73) Assignee: Altera Corporation, San Jose, CA (US)

( * ) Notice: Subject to any disclaimer, the term of this patent is extended or adjusted under 35 U.S.C. 154(b) by 148 days.

(21) Appl. No.: 10/751,283

(22) Filed: Dec. 30, 2003

(51) Int. Cl.
*H03K 19/173* (2006.01)

(52) U.S. Cl. .......................................... 326/38; 326/41
(58) Field of Classification Search ............. 326/37–41
See application file for complete search history.

(56) References Cited

U.S. PATENT DOCUMENTS

| | | | |
|---|---|---|---|
| 5,677,638 A * | 10/1997 | Young et al. ................. | 326/39 |
| 5,847,580 A * | 12/1998 | Bapat et al. .................. | 326/82 |
| 6,653,860 B1* | 11/2003 | Agrawal et al. .............. | 326/41 |
| 2002/0079921 A1* | 6/2002 | Kaviani et al. ............... | 326/40 |

* cited by examiner

*Primary Examiner*—Don Le
(74) *Attorney, Agent, or Firm*—Townsend and Townsend and Crew, LLP

(57) ABSTRACT

A programmable logic device includes a routing structure, which takes the form of multiple distributed OR gates, which are positioned within the device to allow signals to be input from spaced apart logic elements, and present the input signals to other logic elements, which, again, may be spaced apart throughout the device. Each of the distributed OR gates, and its connections to the other logic elements, acts as a multiplexer. Sufficient of these distributed OR gates are provided to allow a bus structure to be implemented within the device. Since the OR gates are provided separately from the logic elements of the programmable logic device, the required bus structure can be implemented more efficiently.

19 Claims, 4 Drawing Sheets

DISTRIBUTED BUS STRUCTURE

BACKGROUND OF THE INVENTION

This invention relates to a programmable logic device (PLD) or field programmable gate array (FPGA). In particular, it relates to the implementation of a structure for routing signals within the device.

A programmable logic device is an integrated circuit, which includes a large number of logic elements, usually arranged in the form of an array.

After manufacture, these logic elements can be combined, by programming the possible interconnections between the logical elements in a particular way, so that the device performs a particular desired set of functions.

In order to allow the required interconnections to be made, the programmable logic device includes a routing structure. The routing structure may, for example, allow very efficient communication between logic elements which are positioned very close to one another within the device, while also allowing communication between elements which are separated by greater distances. The requirement for efficient communication between logic elements is balanced against the consideration that providing the routing structure uses resources in the device which could otherwise be used for other purposes.

After manufacture of the programmable logic device, functions are then allocated to the logic elements, in such a way that logic elements, which will need to communicate with each other on a regular basis in order to perform those functions, are positioned appropriately, with respect to the routing structure.

When the intended functionality of the device requires that a bus structure be provided, this can be achieved by appropriate programming of the logic elements in the programmable logic device. However, large numbers of the available logic elements may be required to implement the desired bus structure in some cases.

SUMMARY OF THE INVENTION

In accordance with the present invention, a programmable logic device comprises a routing structure which allows for efficient communication between logic elements which are spaced apart in the device, without requiring the use of excessive resources to implement such a structure.

In the preferred embodiment, the structure takes the form of multiple distributed OR gates, which are positioned within the device to allow signals to be input from spaced apart logic elements, and present the input signals to other logic elements, which, again, may be spaced apart throughout the device.

Since the OR gates are provided separately from the logic elements of the programmable logic device, a required bus structure can be implemented more efficiently.

DETAILED DESCRIPTION OF THE PREFERRED EMBODIMENTS

Figure 1:
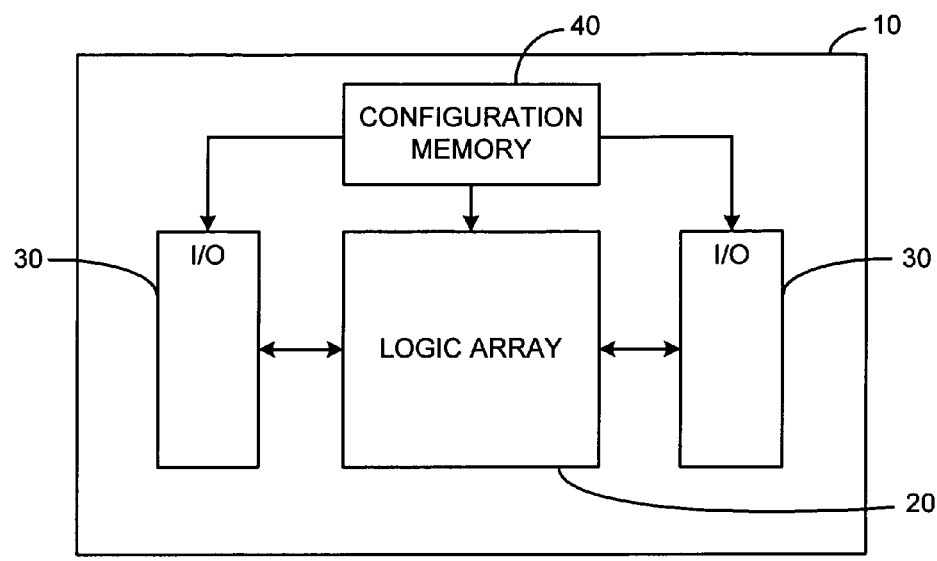
FIG. 1 is a block schematic diagram showing the basic form of a programmable logic device in accordance with the invention.

FIG. 1 is a block schematic diagram showing the general structure of a programmable logic device in accordance with the present invention.

The device 10 is based around a logic array 20, which, as will be described in more detail later, is made up of a relatively large number of elements, each of which can be programmed to perform a selected function, or may have a particular dedicated function. The logic array 20 is in communication with input/output devices 30, which enable connections to be made between elements of the logic array 20 and the input/output pins (not shown) of the programmable logic device 10.

The programmable logic device 10 further comprises a configuration memory 40, which contains data relating to the configuration of the programmable logic device 10.

Based on the data which is stored in the configuration memory 40, specific interconnections are enabled between the elements of the logic array 20, and between respective elements of the logic array 20 and the input/output devices 30.

The result of this is that the configuration data, stored in the configuration memory 40, causes the programmable logic device 10 to perform a specific desired set of functions. When it is desired to reprogram the device to perform a different function, this can be achieved by altering the data in the configuration memory 40.

Figure 2:
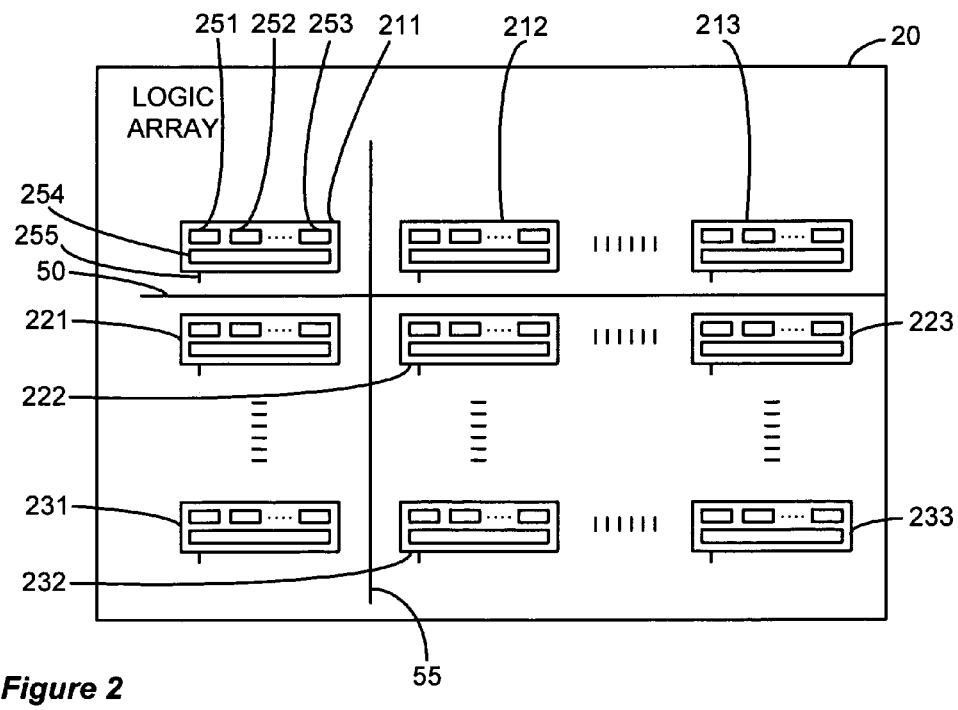
FIG. 2 is a more detailed block schematic diagram showing the form of the logic array in the device of FIG. 1.

FIG. 2 is an enlarged block schematic diagram showing the form of the logic array 20.

The logic array 20 is made up of logic array blocks, which are arranged in rows and columns. For example, FIG. 2 shows logic array blocks 211, 212, 213 in a first row, logic array blocks 221, 222, 223 in a second row, and logic array blocks 231, 232, 233 in a third row, while the logic array blocks 211, 221, 231 are in a first column, logic array blocks 212, 222, 232 are in a second column, and logic array blocks 213, 223, 233 are in a third column. Although only three rows and three columns are shown in FIG. 2, a typical logic array will comprise hundreds of logic array blocks.

In addition, the logic array 20 may comprise other blocks, which have specialised functions. For example, the logic array 20 may comprise memory bocks, or digital signal processing blocks. For the purposes of the present invention, all such specialised blocks can operated in the same way as the logic array blocks which are specifically described herein.

Each of the logic array blocks 211–213, 221–223, 231–233 is made up of multiple logic elements, of which only three of the logic elements 250, 251, 252 in the logic array block 211 are shown in FIG. 2. In a typical programmable logic device, there may for example be in the region of 10 logic elements in each logic array block.

Each logic array block also typically includes an interconnect structure 254 allowing the transfer of data between logic elements within the logic array block. Preferably, a further local interconnect structure 255 allows the transfer of signals between adjacent logic array blocks. The operation of the further local interconnect structure is known to the person of ordinary skill in the art, so that only a small part 255 of that structure is shown in FIG. 2, and it will not be described further herein.

To allow communication between logic elements in logic array blocks which are spaced further apart, the programmable logic device of the present invention also includes a bus structure.

As shown in FIG. 2, the bus structure in one preferred embodiment is made up of horizontal lines 50, which run parallel to the rows of logic array blocks, and vertical bus lines 55, which run parallel to the columns of logic array blocks. However, the invention could be implemented using only horizontal lines 50, or only vertical lines 55, or indeed using lines which are neither entirely horizontal or entirely vertical.

The horizontal bus lines 50 and vertical bus lines 55 may be provided between each adjacent pair of logic array blocks or more preferably, may be spaced apart so that, for example, there are four rows of logic array blocks between adjacent pairs of horizontal bus lines, and four columns of logic array blocks between adjacent vertical bus lines.

Also, although FIG. 2 shows individual horizontal bus lines 50 and vertical bus lines 55, each of those bus lines is preferably made up of a number (for example, 8) of individual bus lines.

Figure 3:
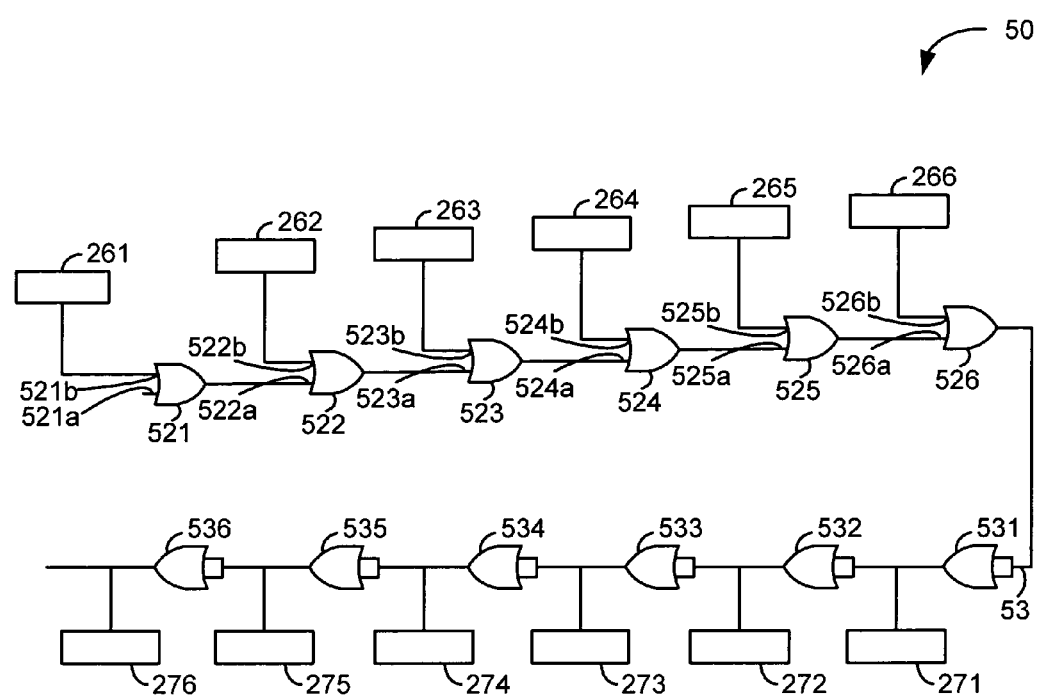
FIG. 3 shows in more detail a part of the routing structure in the logic array of FIG. 2.

FIG. 3 is a schematic diagram, showing the structure of a selected one of the individual horizontal bus lines 50. The bus line 50 takes the form of a distributed OR gate, made up of a number of two-input OR gates 521, 522, 523, 524, 525, 526. A first input 521a of the first two-input OR gate 521 is tied to zero, while a second input 521b is connected to a first selected one of the logic array blocks 261. In another embodiment of the invention, the first input 521a of the first two-input OR gate 521 may be connected to another logic array block.

The output of the first two-input OR gate 521 is connected to a first input 522a of the second two-input OR gate 522, while a second input 522b is connected to a second selected one of the logic array blocks 262. The output of the second two-input OR gate 522 is connected to a first input 523a of the third two-input OR gate 523, while a second input 523b is connected to a third selected one of the logic array blocks 263. The output of the third two-input OR gate 523 is connected to a first input 524a of the fourth two-input OR gate 524, while a second input 524b is connected to a fourth selected one of the logic array blocks 264. The output of the fourth two-input OR gate 524 is connected to a first input 525a of the fifth two-input OR gate 525, while a second input 525b is connected to a fifth selected one of the logic array blocks 265. The output of the fifth two-input OR gate 525 is connected to a first input 526a of the sixth two-input OR gate 526, while a second input 526b is connected to a sixth selected one of the logic array blocks 266.

In addition, although not shown in FIG. 3, the outputs of the OR gates 521–526 may each be connected to one or more other logic array blocks. These other logic array blocks may or may not be in the group of logic array blocks 261–266.

Although the structure shown in FIG. 3 includes a series of two-input OR gates 521–526, these could be replaced by OR gates with mote than two inputs, with those inputs connected to receive signals from different logic array blocks, or different logic elements in a logic array block.

The output of the sixth two-input OR gate 526 is connected to a return line 53, which includes six drivers 531, 532, 533, 534, 535, 536, connected in series to pass signals in the return direction. In this illustrated embodiment of the invention, the drivers 531–536 take the form of OR gates with their inputs tied together, but other forms of driver could be used. For example, the drivers could be the same as the drivers used elsewhere in the array to drive signals along interconnect lines.

The output of the first OR gate 531 is also connected to a first selected logic array block 271, the output of the second OR gate 532 is also connected to a second selected logic array block 272, the output of the third OR gate 533 is also connected to a third selected logic array block 273, the output of the fourth OR gate 534 is also connected to a fourth selected logic array block 274, the output of the fifth OR gate 535 is also connected to a fifth selected logic array block 275, and the output of the sixth OR gate 536 is also connected to a sixth selected logic array block 276.

Thus, the OR gates 531–536 pass the received input signals along the line 53, and to the logic array blocks 271–276.

As shown in FIGS. 2 and 3, the bus line 50 is located between two of the rows of logic array blocks, with an input of each of the OR gates 521–526 being connected to a respective logic array block 261–266 in one of those rows, and an output of each of the OR gates 531–536 being connected to a respective logic array block 271–276 in the other of those two rows.

Figure 4:
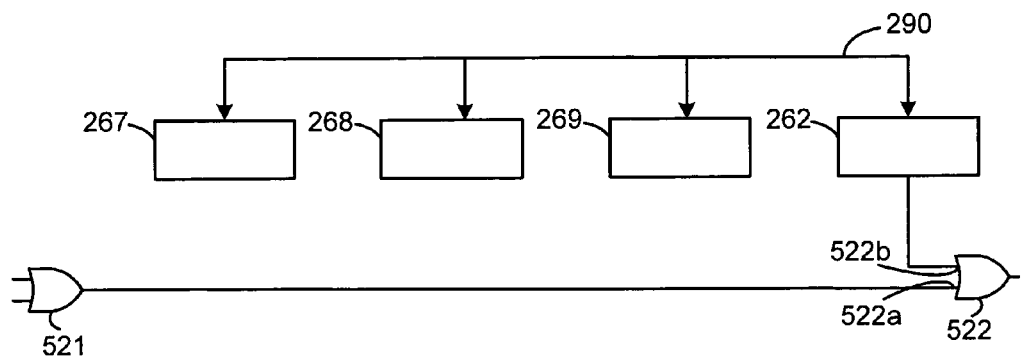
FIG. 4 shows in further detail a part of the structure shown in FIG. 3.

In a preferred embodiment of the invention, the logic array blocks 261–266 and 271–276 are subsets of the logic array blocks in their respective rows. FIG. 4 shows a part of the structure of FIG. 3 in more detail to illustrate one preferred embodiment of the invention. Specifically, FIG. 4 shows only the second selected logic array block 262 and the first and second OR gates 521, 522 from the structure shown in FIG. 3. In addition, there are three further logic array blocks 267, 268, 269, to the left of the logic array block 262. These additional logic array blocks 267, 268, 269 do not have any direct connection on to the bus line 50, but they are connected to the second selected logic array block 262 by a line 290, which forms part of the local interconnect structure 255 mentioned above, and so they can be indirectly connected to the bus line 50.

In addition, as mentioned above, one or more of the additional logic array blocks 267–269 may have a connection from the bus line 50, that is, for example, from the output of the OR gate 521.

Although FIG. 4 shows three additional logic array blocks 267, 268, 269, any convenient number of additional logic array blocks can be provided. Thus, there may be one of the OR gates 521–526 for each group of four logic array blocks, or each group of eight logic array blocks, for example.

Thus any of the logic array blocks 262, 267, 268, 269 can be connected to the bus line 50, although the selected logic array block 262 can be connected to the bus line 50 more efficiently than can the logic array blocks 267, 268, 269, which do not have a direct connection thereto.

The structure shown in FIG. 4 is preferably repeated along the bus line 50. Thus, associated with each of the selected logic array blocks 261–266 having a direct connection into the bus line 50, there may be three additional logic array blocks, which do not have a direct connection to the bus line 50, but can be connected thereto by means of the local interconnect structure and the respective selected logic array block. Similarly, associated with each of the selected logic array blocks 271–276 having a direct connection into the line 53, there may be three additional logic array blocks, which do not have a direct connection to the line 53, but can be connected thereto by means of the local interconnect structure and the respective selected logic array block.

Many other implementations are possible within the scope of the invention. For example, although FIG. 3 shows the selected logic array blocks 261–266 and the selected logic array blocks 271–276 as being in different rows of the logic array 20, the corresponding connections could equally be made to logic array blocks in a single row of the logic array. Indeed, one or more of the logic array blocks could be connected both to an input of one of the OR gates 521–526 and to the output of one of the OR gates 531–536.

In addition, while FIGS. 3 and 4 show a preferred implementation of a bus line 50 running parallel to the rows of logic array blocks in the logic array exactly the same structure can be provided to implement a bus line 55 running parallel to the columns of logic array blocks in the logic array.

Together, the OR gates 521–526 form what can be regarded as a distributed OR gate, that is, a multiple-input OR gate, having its inputs taken from spaced apart points in the logic array 20.

The signal at the output of the final OR gate 526 is then the logical OR function of the two inputs of the first OR gate 521 and the respective second inputs 522b–526b of the remaining OR gates 522–526.

All of the data present at the output of the final OR gate 526 is then passed along the line 53, and made available to every one of the logic array blocks 271–276.

Figure 5:
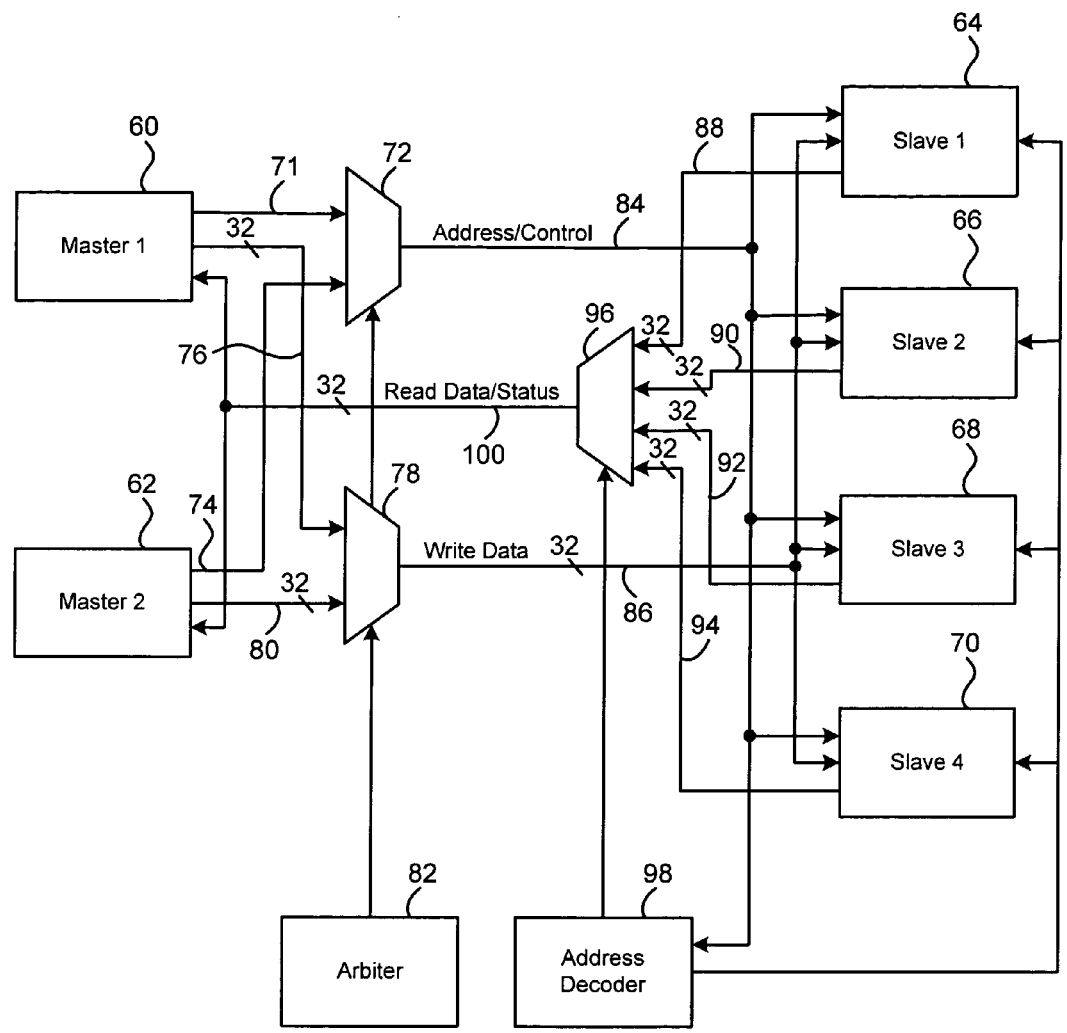
FIG. 5 is a functional block diagram illustrating a system which may be implemented in a device according to the present invention.

FIG. 5 is a functional block schematic diagram of a typical system which may be implemented in programmable logic device 10 of the present invention. Thus, it is important to note when considering FIG. 5 that it illustrates the functional blocks making up the system, and their interconnections, but it does not accurately represent the relative positions of those blocks within the system. As is conventional in a programmable logic device, the required functional blocks are obtained by appropriate allocation of the functionality to the logic array blocks, and any of those functional blocks may in fact use logic array blocks which are relatively widely spaced in the physical device.

The system includes two master devices, namely a first master 60 and a second master 62. The system also includes four slave devices, namely a first slave 64, a second slave 66, a third slave 68 and a fourth slave 70. The structure interconnecting the two master devices and the four slave devices acts as a bus structure. As will be understood by a person of ordinary skill in the art, the masters 60, 62 are functional blocks which initiate data transfers on the bus. For example, a processor will generally be a bus master. The slaves 64, 66, 68, 70 are functional blocks which respond to commands and data transfers initiated by the bus masters 60, 62. For example, a memory device will generally be a slave.

Control signals, such as address signals, are passed from the first master 60 on a control line 71 to a first multiplexer 72, and are passed from the second master 62 to the first multiplexer 72 on a control line 74. Data signals are passed from the first master 60 on a 32-bit data line 76 to a second multiplexer 78, and are passed from the second master 62 to the second multiplexer 78 on a 32-bit data line 80.

Under the control of an arbiter 82, it is determined which of the master devices 60, 62 has priority at any given time. Based on the determined priority, the first and second multiplexers 72, 78 determine which of the master devices 60, 62 control the data transfer process at that time. Therefore, based on the output from the arbiter 82, the first and second multiplexers 72, 78 pass signals on an address/control line 84 to each of the slave devices 64, 66, 68, 70. If data is being sent from the relevant bus master at that time, to be written to one of the slave devices, then the first and second multiplexers 72, 78 also pass data on a 32-bit data line 86 to each of the slave devices 64, 66, 68, 70. The signal on the address/control line 84 is also passed to an address decoder 98, which determines which of the slave devices 64, 66, 68, 70 should receive the data, and sends an appropriate control signal to the slave device which is the intended recipient.

If data is to be read from one of the slave devices 64, 66, 68, 70, then, on the basis of a control signal received at the respective slave device on the address/control line 84, data is transferred from that slave device on a respective 32-bit data line 88, 90, 92, 94 to a third multiplexer 96. On the basis of a signal received from the address decoder 98, the multiplexer 96 determines which of the slave devices 64, 66, 68, 70 is responsible for outputting data at that time, and allows the data from that slave device to pass on a 32-bit read data/status line 100 to the two master devices 60, 62. Only the master device which is expecting the data at that time will then act upon the received data.

As shown in FIG. 5, and as described above, the system is generally conventional. However, the system shown in FIG. 5 can be efficiently implemented in a programmable logic device in accordance with the present invention, by virtue of the routing structure described herein.

Referring back to FIG. 3, in operation of the device, each of the logic array blocks is controlled so that it drives a logic "0" on all address and data outputs, unless it is actively involved in a transaction. Further the logic array blocks are controlled so that only one of the logic array blocks connected to the bus line 50 presents data to the bus line at any one time.

This allows each of the multiplexers 72, 78, 96 to be implemented by means of a distributed OR gate structure as shown in FIG. 3. This has the effect that the signal at the output of the final OR gate 526 at any one time is equal to the data presented to the bus line by the presently active one of the logic array blocks.

Thus, given a programmable logic device, which includes a sufficiently large number of these distributed OR gate structures, some of the functionality of the master devices 60, 62 can be assigned to logic array blocks such as the logic array blocks 261–266 shown in FIG. 3, which are connected to the inputs of OR gates 521–526, while some of the functionality of the slave devices 64, 66, 68, 70 can be assigned to logic array blocks such as the logic array blocks 271–276 shown in FIG. 3, which are connected to the outputs of OR gates 531–536 in the same distributed OR gate structure.

One distributed OR gate structure as shown in FIG. 3 allows one bit of data on the 32-bit data line 76 from the first master device 60 to be multiplexed together with one bit of data on the 32-bit data line 80 from the second master device 62, and then supplied to each of the slave devices.

Appropriate control signals to the relevant logic array blocks can ensure that data from the correct master device is inserted onto the line 50. Usually, the logic array blocks 271–276 are controlled so that only one of those logic array blocks connected to the line 53 acts on the data on the line at any one time. Thus, only the intended slave device reads the data on the line.

Similarly, some of the functionality of the slave devices 64, 66, 68, 70 can be assigned to logic array blocks such as the logic array blocks 261–266 shown in FIG. 3, which are connected to the inputs of OR gates 521–526, while some of the functionality of the master devices 60, 62 can be assigned to logic array blocks such as the logic array blocks 271–276 shown in FIG. 3, which are connected to the outputs of OR gates 531–536 in the same distributed OR gate structure. One distributed OR gate structure as shown in FIG. 3 then allows one bit of data on the 32-bit data line 88 from the first slave device 64 to be multiplexed together with one bit of data on each of the 32-bit data lines 90, 92, 94 from the second, third and fourth slave devices 66, 68, 70 respectively, and then supplied to both of the master devices 60, 62. Appropriate control signals to the relevant logic array blocks can ensure that data from the correct slave device is inserted onto the line 50, and that only the intended master device reads the data on the line.

It can therefore be seen that, since each of the distributed OR gate structures shown in FIG. 3 allows one bit of data to be transferred to or from a relevant bus master device, it is necessary to provide a sufficiently large number of these distributed OR gate structures to allow the implementation of the required multiplexers. Moreover, not only must there be a sufficiently large number of distributed OR gate structures, but the available distributed OR gate structures must be located such that the functionality of the required master devices and slave devices can conveniently be allocated to logic array devices which can efficiently connect to the available distributed OR gate structures. For example, between each adjacent pair of rows and columns in the array, there is a routing channel made up of several routing lines. One or more of the routing lines in some or all of the routing channels may be implemented as part of a distributed OR gate structure.

In many cases, it will be preferable to provide a sufficient number of distributed OR gate structures, in a programmable logic device, such that not all of those distributed OR gate structures are required to implement a bus structure when the functionality is assigned to the device. Indeed, the programmable logic device may be used to implement a system which requires no bus structure at all. In such a case, it will be noted that the distributed OR gate structures, which are not being used to implement a bus structure, can be used as part of the general routing resources of the device. That is, the inputs to all but one of the OR gates 521–526 may be tied to zero, with a logic array device connected to the remaining one of the OR gates 521–526, while only one of the OR gates 531–536 has a logic array connected to its output. In that case, the line 50 simply interconnects those two logic array gates.

Alternatively, when it is not being used for routing as described above, a distributed OR gate structure may simply be used as an OR gate within the device, using some or all of the available inputs.

This means that the distributed OR gate structures described herein provide an efficient way of implementing a bus structure in a programmable logic device, but also ensures that, if some or all of the provided distributed OR gate structures are not required in implementing a bus structure, then they can still be used.

The invention claimed is:

1. A programmable logic device, comprising a plurality of logic elements and a routing structure, wherein the routing structure comprises a plurality of routing lines, and wherein each routing line comprises:
   a plurality of first OR gates, each first OR gate having at least a first input connected to a respective one of said logic elements in a first group of said logic elements, and each first OR gate except a final first OR gate in said line having an output connected to a second input of a respective succeeding one of said first OR gates, such that a signal from one of said logic elements in the first group of logic elements appears on an output of the final first OR gate in said line; and
   a return line, comprising a plurality of drivers connected in series, each of said drivers having a connection to a respective one of a plurality of said logic elements in a second group of logic elements, such that the signal appearing on said output of the final first OR gate in said line may be passed to said plurality of logic elements in the second group of logic elements.

2. A programmable logic device as claimed in claim 1, wherein the first group of logic elements and the second group of logic elements are mutually exclusive.

3. A programmable logic device as claimed in claim 1, wherein the first group of logic elements and the second group of logic elements contain at least one logic element in common.

4. A programmable logic device as claimed in claim 1, wherein the logic elements in said programmable logic device are arranged in an array, the array comprising rows and columns of logic elements.

5. A programmable logic device as claimed in claim 4, wherein the first group of logic elements are located within a first row of said array.

6. A programmable logic device as claimed in claim 5, wherein the second group of logic elements are located within said first row of said array.

7. A programmable logic device as claimed in claim 5, wherein the second group of logic elements are located within a second row of said array different from said first row.

8. A programmable logic device as claimed in claim 5, wherein the first group of logic elements are spaced apart at regular intervals within said first row of said array.

9. A programmable logic device as claimed in claim 7, wherein the second group of logic elements are spaced apart at regular intervals within said second row of said array.

10. A programmable logic device as claimed in claim 4, wherein the first group of logic elements are located within a first column of said array.

11. A programmable logic device as claimed in claim 10, wherein the second group of logic elements are located within said first column of said array.

12. A programmable logic device as claimed in claim 10, wherein the second group of logic elements are located within a second column of said array different from said first column.

13. A programmable logic device as claimed in claim 10, wherein the first group of logic elements are spaced apart at regular intervals within said first column of said array.

14. A programmable logic device as claimed in claim 12, wherein the second group of logic elements are spaced apart at regular intervals within said second column of said array.

15. A programmable logic device, comprising:
   a plurality of logic elements arranged in an array, the array comprising rows and columns of logic elements, the rows of said array being located at respective vertical positions in said array, and the columns of said array being located at respective horizontal positions in said array; and
   a routing structure, wherein the routing structure comprises a first plurality of routing lines, running parallel to said rows of logic elements at a first vertical position in said array; a second plurality of routing lines, running parallel to said rows of logic elements at a second vertical position in said array, a third plurality of routing lines, running parallel to said columns of logic elements at a first horizontal position in said array; and a fourth plurality of routing lines, running parallel to said columns of logic elements at a second horizontal position in said array, wherein each routing line comprises:

a plurality of first OR gates, each first OR gate having at least a first input connected to a respective one of said logic elements in a respective first group of said logic elements, and each first OR gate except a final first OR gate in said line having an output connected to a second input of a respective succeeding one of said first OR gates, such that a signal from one of said logic elements in the first group of logic elements appears on an output of the final first OR gate in said line; and a return line, comprising a plurality of drivers connected in series, each of said drivers having a connection to a plurality of said logic elements in a respective second group of logic elements, such that the signal appearing on said output of the final first OR gate in said line may be passed to said plurality of logic elements in the second group of logic elements.

16. A programmable logic device as claimed in claim 15, wherein routing lines of said first plurality of routing lines and of said second plurality of routing lines are connected to respective logic elements spaced apart along said rows of logic elements; and routing lines of said third plurality of routing lines and of said fourth plurality of routing lines are connected to respective logic elements spaced apart along said columns of logic elements.

17. In a programmable logic device, comprising a plurality of logic elements and a routing structure, wherein the routing stricture comprises a plurality of distributed OR gates, each distributed OR gate comprising logic circuitry having a plurality of inputs from a first plurality of logic elements distributed amongst said logic elements and forming a logic OR function from said inputs, and an output of each distributed OR gate being connected to a second plurality of logic elements distributed amongst said logic elements, a method of forming a bus structure, the method comprising:

allocating functionality to said first plurality of logic elements, and to said second plurality of logic elements in a first distributed OR gate; and controlling said first plurality of logic elements such that they each output a logical zero except when involved in a data transaction, such that outputs from said first plurality of logic elements are multiplexed together, and made available to said second plurality of logic elements via a return line coupled to an end OR gate of the plurality of distributed OR gates.

18. A method of forming a bus structure, as claimed in claim 17, further comprising:

allocating additional functionality to said first plurality of logic elements, and to said second plurality of logic elements, such that said second plurality of logic elements are connected to the inputs of a second distributed OR gate and the output of the second distributed OR gate is connected to the first plurality of logic elements; and controlling said second plurality of logic elements such that they each output a logical zero except when involved in a data transaction, such that outputs from said second plurality of logic elements are multiplexed together, and made available to said first plurality of logic elements.

19. A method of forming a bus structure, as claimed in claim 18, comprising allocating functionality to said first plurality of logic elements such that they form parts of respective bus master devices, and allocating functionality to said second plurality of logic elements such that they form parts of respective slave devices in said bus structure.

* * * * *